(12) United States Patent
Westwick et al.

(10) Patent No.: US 11,057,029 B2
(45) Date of Patent: Jul. 6, 2021

(54) GATE DRIVER WITH INTEGRATED MILLER CLAMP

(71) Applicant: Silicon Laboratories Inc., Austin, TX (US)

(72) Inventors: Alan L. Westwick, Georgetown, TX (US); Peter Onody, Budapest (HU); András V. Horváth, Budapest (HU); Tamás Marozsák, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/694,100

(22) Filed: Nov. 25, 2019

(65) Prior Publication Data

US 2021/0159898 A1 May 27, 2021

(51) Int. Cl.
*H03K 17/16* (2006.01)
*H03K 17/0812* (2006.01)
*H02P 29/024* (2016.01)

(52) U.S. Cl.
CPC ......... *H03K 17/163* (2013.01); *H02P 29/024* (2013.01); *H03K 17/08122* (2013.01); *H03K 17/08128* (2013.01); *H03K 17/168* (2013.01)

(58) Field of Classification Search
None
See application file for complete search history.

(56) References Cited

U.S. PATENT DOCUMENTS

| | | | |
|---|---|---|---|
| 6,097,582 A | 8/2000 | John | |
| 7,948,277 B2 | 5/2011 | Nakatake | |
| 7,978,453 B2 | 7/2011 | Sharaa | |
| 8,213,192 B2 | 7/2012 | Konecny et al. | |
| 8,362,800 B2 * | 1/2013 | Or-Bach | H01L 25/0652 326/12 |
| 9,054,621 B2 * | 6/2015 | Liu | H02P 21/0003 |
| 9,166,499 B2 | 10/2015 | Suzuki | |
| 9,294,019 B2 * | 3/2016 | Liu | H02P 21/0003 |
| 9,374,028 B2 * | 6/2016 | Nondahl | H02P 6/182 |
| 9,467,138 B2 | 10/2016 | Osanai | |
| 9,490,738 B2 * | 11/2016 | Nondahl | H02M 7/53873 |
| 9,698,654 B2 * | 7/2017 | Santos | H02H 7/0822 |
| 10,038,434 B2 | 7/2018 | Volke | |
| 10,469,075 B2 | 11/2019 | Horvath | |
| 10,514,016 B1 | 12/2019 | Nodake | |
| 2004/0136135 A1 | 7/2004 | Takahashi | |

(Continued)

OTHER PUBLICATIONS

Infineon, "EiceDRIVER™ High Voltage Gate Driver IC with Reinforced Isolation," Final Datasheet, Revision 2.1, Oct. 22, 2018, pp. 1-33.

(Continued)

*Primary Examiner* — Lincoln D Donovan
*Assistant Examiner* — Khareem E Almo
(74) *Attorney, Agent, or Firm* — Zagorin Cave LLP

(57) ABSTRACT

A gate driver with an integrated Miller clamp controls a high-power drive device coupled to a terminal of a package that houses an integrated circuit coupled to the terminal. A method includes generating an indication of a level of a signal on the terminal with respect to a predetermined signal level. The method includes configuring a variable strength driver of the integrated circuit to charge, discharge, or clamp the terminal based on a control signal and the indication.

21 Claims, 5 Drawing Sheets

(56) References Cited

U.S. PATENT DOCUMENTS

| | | | |
|---|---|---|---|
| 2004/0251951 | A1 | 12/2004 | Beck |
| 2008/0106319 | A1 | 5/2008 | Bayerer |
| 2008/0315925 | A1 | 12/2008 | Alfano |
| 2009/0021294 | A1 | 1/2009 | Morishita |
| 2010/0148830 | A1* | 6/2010 | Nilson ................. H03K 17/168 327/108 |
| 2011/0050198 | A1 | 3/2011 | Dong et al. |
| 2011/0157919 | A1 | 6/2011 | Yedevelly et al. |
| 2011/0157941 | A1 | 6/2011 | Yedevelly et al. |
| 2012/0013370 | A1 | 1/2012 | Morishita |
| 2012/0161841 | A1 | 6/2012 | Dong et al. |
| 2012/0194218 | A1* | 8/2012 | Or-Bach ............. H01L 27/0688 326/102 |
| 2012/0218669 | A1 | 8/2012 | Ioannidis et al. |
| 2013/0242438 | A1 | 9/2013 | Fukuta |
| 2015/0015309 | A1 | 1/2015 | Werber |
| 2015/0070078 | A1 | 3/2015 | Jeong et al. |
| 2015/0085403 | A1 | 3/2015 | Santos et al. |
| 2016/0087560 | A1* | 3/2016 | Miller ....................... H02P 6/28 318/400.03 |
| 2016/0218046 | A1* | 7/2016 | Or-Bach ............. H03K 19/1774 |
| 2016/0359480 | A1 | 12/2016 | Kim |
| 2018/0026629 | A1* | 1/2018 | Ptacek ............. H03K 19/00361 327/109 |
| 2018/0115310 | A1 | 4/2018 | Horiguchi et al. |
| 2018/0351546 | A1 | 12/2018 | Horvath |
| 2019/0229640 | A1* | 7/2019 | Aichriedler .......... G01R 15/202 |
| 2019/0372567 | A1 | 12/2019 | Yoshida et al. |

OTHER PUBLICATIONS

Obara, H., et al., "Active Gate Control in Half-Bridge Inverters Using Programmable Gate Driver ICs to Improve Both Surge Voltage and Converter Efficiency," IEEE Transactions on Industry Applications, vol. 54, No. 5, Sep./Oct. 2018, pp. 4603-4611.

Agilent Technologies, "2.0 Amp Gate Drive Optocoupler with Integrated (VCE) Desaturation Detection and Fault Status Feedback," HCPL-316J, Mar. 1, 2005, 33 pages.

Allan, R., "SiC and GaN vs. IGBTs: The Imminent Tug of War for Supremacy," Power Electronics, downloaded from powerelectronics.com, Feb. 24, 2020, 2 pages.

Analog Devices, Inc., "Isolated Half-Bridge Driver with Integrated High-Side Supply," ADuM5230, 2008-2013, 16 pages (downloaded Sep. 2013).

Analog Devices, Inc., "Isolated Half-Bridge Gate Driver with Integrated Isolated High-Side Supply," ADuM6132, 2008-2012 16 pages (downloaded Sep. 2013).

Avago Technologies, "Desaturation Fault Detection Optocoupler Gate Drive Products with Feature: ACPL-333J, ACPL-330J, ACPL-332J, ACPL-331J, and HCPL-316J," Application Note 5324, Jan. 9, 2012, 7 pages.

Avago Technologies, "Dual-Output Gate Drive Optocoupler Interface with Integrated (VCE) DESAT Detection, FAULT and UVLO Status Feedback," ACPL-339J, Jan. 31, 2013, 23 pages.

Avago Technologies, "Active Miller Clamp Products with Feature: ACPL-331J, ACPL-332J," Application Note 5314, Jul. 21, 2010, 6 pages.

Infineon, "EiceDRIVER™ External Booster for Driver IC," Application Note, AN2013-10, Revision 1.6, Aug. 5, 2014, 17 pages.

Silicon Labs, "AN1009: Driving MOSFET and IGBT Switches Using the Si828x," downloaded from silabs.com on Feb. 21, 2020, 22 pages.

Silicon Labs, "Si8285/86 Data Sheet," downloaded from silabs.com on Feb. 21, 2020, 33 pages.

Texas Instruments, "Fully-Differential Isolation Amplifier," AMC1200 AMC1200B, Apr. 2011—Revised Aug. 2012, 24 pages.

Texas Instruments, "Precision Lowest-Cost Isolation Amplifier," ISO124, Sep. 1997—Revised Sep. 2005, 17 pages.

Texas Instruments, "TI Designs, IGBT Gate Driver Reference Design for Parallel IGBTs with Short-Circuit Protection and External BJT Buffer," TIDUC70A, Dec. 2016—Revised Jan. 2017, 33 pages.

Texas Instruments, "Understanding the Short Circuit Protection for Silicon Carbide MOSFETs," TI TechNotes, Jan. 2018—Revised Mar. 2019, pp. 1-4.

Vacca, G.,"Benefits and Advantages of Silicon Carbide Power Devices Over Their Silicon Counterparts," Semiconductor Today, Compounds & Advanced Silicon, vol. 12, Issue 3, Apr./May 2017, 4 pages.

* cited by examiner

GATE DRIVER WITH INTEGRATED MILLER CLAMP

BACKGROUND

Field of the Invention

This disclosure is related to circuits and more particularly to control circuits for high-power applications.

Description of the Related Art

In a typical control application, a processor system provides one or more control signals for controlling a load system. During normal operation, a large DC or transient voltage difference may exist between a domain of the processor system and a domain of the load system, thus requiring an isolation barrier between the processor system and the load system. For example, one domain may be "grounded" at a voltage that is switching with respect to earth ground by hundreds or thousands of volts. Accordingly, an intermediate system includes isolation that prevents damaging currents from flowing between the processor system and the load system. Although the isolation prevents the processor system from being coupled to the load system by a direct conduction path, an isolation communications channel allows communication between the two systems using optical (opto-isolators), capacitive, inductive (transformers), or electromagnetic techniques. In at least one embodiment, the isolation communications channel blocks DC signals and only passes AC signals. The intermediate system typically uses a voltage converter and output driver to provide the control signal at voltage levels suitable for the load system.

Referring to FIG. 1, in an exemplary motor control application, processor 100, which may be a microprocessor, microcontroller, or other suitable processing device, operates in a first domain (i.e., VDD1, e.g., 5 Volts (V)) and provides one or more signals for a high power load system operating in a second domain (i.e., VDD3, e.g., 600V). Systems 102 each include an isolation barrier 130 and an isolation communications channel for safely communicating control signals from processor 100 to drivers 106, which drive high-power drive devices 108 and 109 of a three-phase inverter used to deliver three-phase power to motor 120. Exemplary high-power drive devices include power metal-oxide-semiconductor field-effect transistors (MOSFETs), insulated-gate bipolar transistors (IGBTs), Gallium-Nitride (GaN) MOSFETs, Silicon-Carbide power MOSFETs, or other suitable devices able to deliver high currents over short periods of time.

Voltage converters 104 convert an available power supply voltage from VDD3 to a voltage level (i.e., VDD2, e.g., approximately 15 V) usable by a high side of systems 102 and drivers 106. Note that in other embodiments, a single voltage converter 104 converts one power supply voltage from a first voltage level (e.g., VDD3) to multiple other voltage levels (e.g., VDD1 and VDD2) and/or provides multiple outputs of a particular voltage (e.g., multiple VDD2 outputs corresponding to multiple systems 102). Drivers 106 provide switch control signals at levels required by corresponding high-power drive devices 108 or 109 of the three-phase inverter. The load motor requires three-phase power at high power levels. Systems 102 that correspond to high-power devices coupled to VDD3 (high-side inverter devices), are "grounded" at a voltage that is switching with respect to earth ground by the high voltage levels of VDD3.

Typical high-power drive devices 108 and 109 of the three-phase inverter that are used to drive motor 120 require substantial turn-on voltages (e.g., voltages in the range of tens of Volts) and are susceptible to fault conditions that may damage those devices. Accordingly, flexible techniques for handling fault conditions without damaging high-power drive devices or the load that those devices control are desired.

SUMMARY OF EMBODIMENTS OF THE INVENTION

In at least one embodiment, a method controls a high-power drive device coupled to a terminal of a package housing a driver integrated circuit coupled to the terminal. The method includes generating an indication of a level of a signal on the terminal relative to a predetermined signal level. The method includes configuring a variable strength driver of the driver integrated circuit to charge, discharge, or clamp the terminal based on a control signal and the indication.

In at least one embodiment, a driver integrated circuit for controlling a high-power drive device disposed externally to a package of the driver circuit includes an output node and a variable strength driver circuit coupled to the output node. The driver integrated circuit includes a feedback circuit configured to generate a feedback signal based on a predetermined signal level and a signal level on the output node. The driver integrated circuit includes a driver controller circuit responsive to a received control signal and the feedback signal to configure the variable strength driver circuit to charge, discharge, or clamp the output node based on the received control signal and the feedback signal.

In at least one embodiment, a method for controlling a high-power drive device disposed externally to a package of a driver circuit includes configuring a variable strength driver circuit as an output driver circuit in response to a signal on a terminal of the package being greater than a predetermined signal level. The output driver circuit is responsive to a received control signal. The method includes configuring the variable strength driver circuit as a Miller clamp circuit in response to the signal on the terminal falling below the predetermined signal level.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 2:
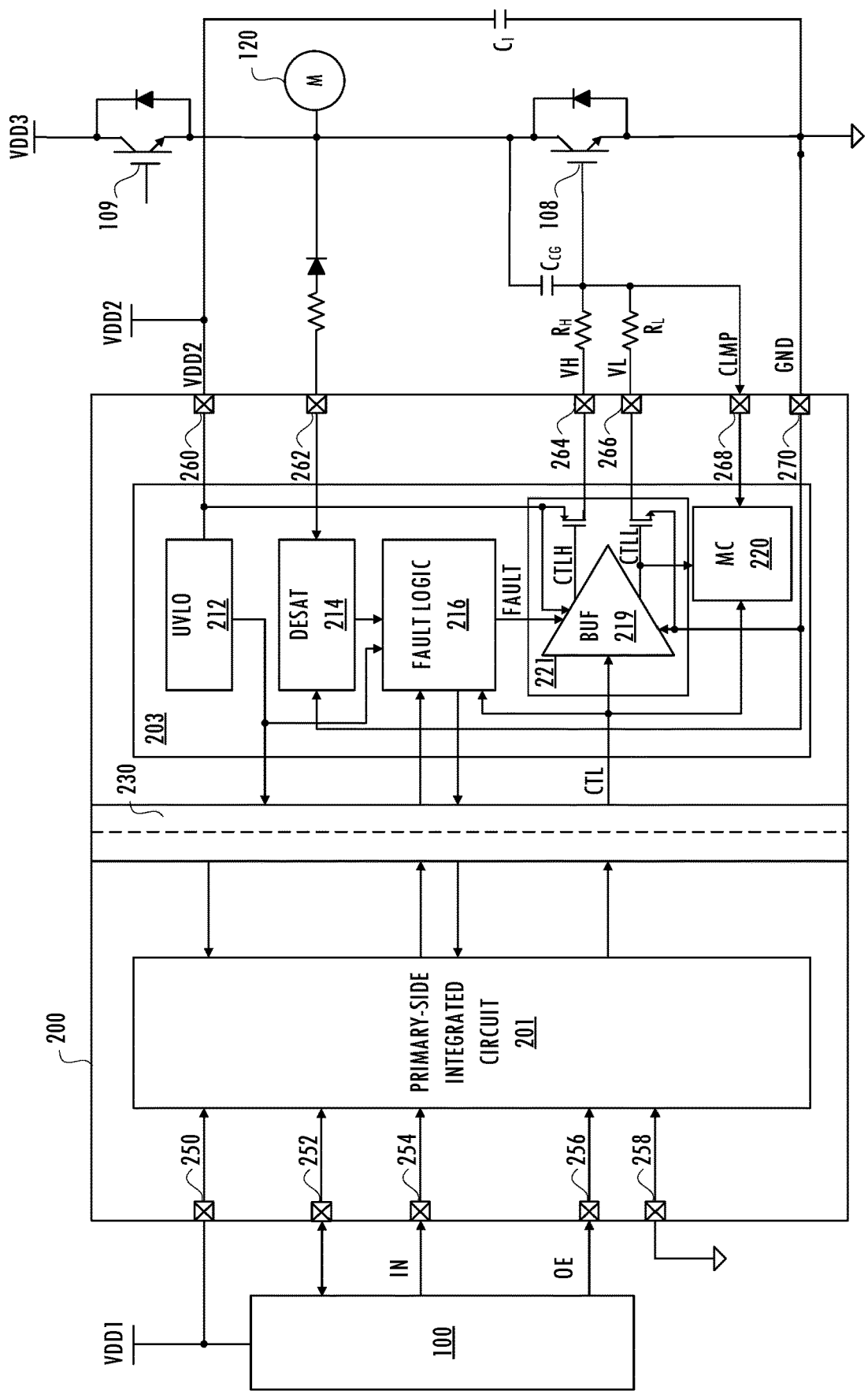
FIG. 2 illustrates a functional block diagram of a portion of the motor control system of FIG. 1 including fault detection circuitry and driver control circuits.

Referring to FIG. 2, in an exemplary motor control application, processor 100 receives a voltage (i.e., VDD1, e.g., 5V) and provides one or more signals for a high power load system operating in a second domain (i.e., VDD3, e.g., hundreds of volts). Driver product 200 includes isolation barrier 230 and a communication channel for safely communicating control signals from processor 100 across isolation barrier 230 to drive high-power drive devices of a three-phase inverter used to deliver three-phase power to motor 120. In an exemplary embodiment, driver product 200 includes multiple integrated circuits configured as a multichip module in a single package. For example, driver product 200 includes primary-side integrated circuit 201 and secondary-side integrated circuit 203. Primary-side integrated circuit 201, receives a control signal from processor 100 and communicates the signal across isolation barrier 230 to secondary-side integrated circuit 203. In such embodiments, terminals 250, 252, 254, . . . , 270 are pins of a package of the multi-chip module and are coupled to external elements, e.g., discrete resistors and capacitors, and to processor 100.

Driver product 200 includes isolation barrier 230, which isolates the domains on a first side (e.g., primary-side integrated circuit 201) of driver product 200, which operates using VDD1 (e.g., a voltage less than ten volts), and a second side (e.g., secondary-side integrated circuit 203) of driver product 200, which operates using VDD2 (e.g., a voltage of tens of volts). An isolation communications channel facilitates communication between primary-side integrated circuit 201 and secondary-side integrated circuit 203. Any suitable communications technique that does not use a conductive path between the two sides may be used, e.g., optical, capacitive, inductive, or electromagnetic techniques. The isolation communications channel facilitates communication of a control signal to secondary-side integrated circuit 203 from processor 100 via primary-side integrated circuit 201.

An exemplary isolation communications channel uses digital modulation (e.g., on-off keying modulation) to communicate one or more digital signals between primary-side integrated circuit 201 and secondary-side integrated circuit 203, although other communication protocols may be used. In general, on-off keying modulation is a form of amplitude-shift keying modulation that represents digital data as the presence or absence of a carrier wave or oscillating signal having a carrier frequency $f_c$ (e.g., 500 MHz-1 GHz). The presence of the carrier for a specified duration represents a binary one, while its absence for the same duration represents a binary zero. This type of signaling is robust for isolation applications because a logic '0' state sends the same signal (e.g., nothing) as when the primary side loses power and the device gracefully assumes its default state. That behavior is advantageous in driver applications because it will not accidentally turn on a load device being driven, even when the primary side loses power. However, the isolation communications channel may use other types of signals (e.g., pulse width modulated signals or other types of amplitude shift keying modulated signals). The digital modulation scheme used may be determined according to performance specifications (e.g., signal resolution) and environment (e.g., probability of transient events) of the target application.

Secondary-side integrated circuit 203 includes driver 221, which generates one or more output control signals based on received control signal CTL received from primary-side integrated circuit 201, which receives the control signal terminal 254 from processor 100. Driver 221 provides corresponding signals to terminals 264 and 266. Buffer 219 generates control signals CTLH and CTLL at appropriate signal levels for controlling pull-up and pull-down devices of driver 221, respectively. Buffer 219 may generate one control signal or two separate control signals for the pull-up device and the pull-down device based on received control signal CTL. External resistance $R_H$ adjusts the pull-up strength by $1/R_H$ independently from external resistance $R_L$ that adjusts the pull-down strength by $1/R_L$. Although received control signal CTL is illustrated as a single-ended signal based on input control signal CTL received from processor 100 on terminal 254, note that in other embodiments, input control signal IN and received control signal CTL are differential signals. In general, signals illustrated herein as single-ended signals may be implemented as differential signals in other embodiments and signals illustrated herein as differential signals may be implemented as single-ended signals in other embodiments.

The pull-up strength and the pull-down strength of the output control signal provided to the control terminal of high-power drive device 108 can be independently adjusted from on-resistance $R_{DS(ON)}$ of the integrated pull-up output device coupled to terminal 264 using one or more passive elements. For example, resistance $R_H$ adjusts the pull-up strength. Resistor $R_L$ adjusts the pull-down strength of the signal provided to the gate of high-power drive device 108 via terminal 266 to have a strength different from the pull-up strength of the signal provided to the gate of high-power drive device 108. In a typical configuration, the pull-up time is slower than the pull-down time and resistances $R_H$ and $R_L$ will vary with specifications of the device (e.g., power MOSFET, IGBT, GaN MOSFET, Si-Carbide power MOSFET, etc.) used as high-power drive device 108.

In at least one embodiment, the isolation communications channel feeds back voltage information or fault information from secondary-side integrated circuit 203 to primary-side integrated circuit 201. Primary-side integrated circuit 201 or processor 100 uses that information to adjust operating parameters or generate one or more fault indicators that may be used for automatically handling faults by controlling output driver 221 accordingly. For example, secondary-side integrated circuit 203 includes modules that detect fault conditions associated with high-power drive devices, e.g., desaturation detector 214, and may also detect user-initiated faults received from processor 100. Fault indicator(s) may be used by secondary-side integrated circuit 203 to prevent damage to the high-power drive devices, load system, or user of the load system. In addition, secondary-side integrated circuit 203 may send an indication of a fault or associated diagnostic information to primary-side integrated circuit 201 and/or processor 100.

Figure 1:
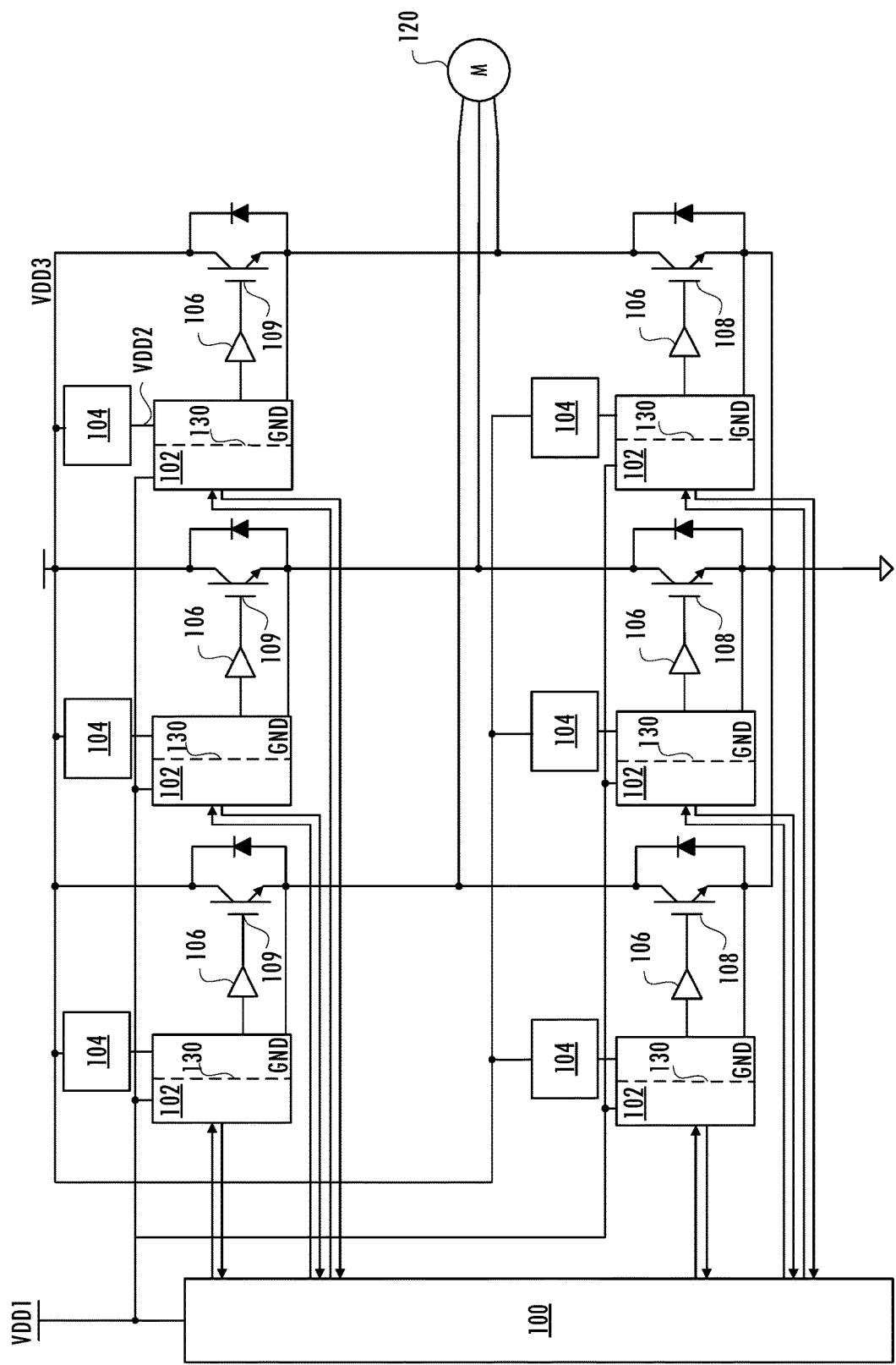
FIG. 1 illustrates a functional block diagram of a typical motor control system.

In at least one embodiment, secondary-side integrated circuit 203 includes desaturation fault protection for high-power semiconductor devices, which protects against short-circuit current events that may destroy high-power drive device 108. This fault may result from an insufficient gate drive signal caused by inverter gate driver misbehavior, drive supply voltage issues, a short circuit in a power stage, or other excessive current or power dissipation of the high-power drive devices. Those events can substantially increase power consumption that quickly overheats and damages the corresponding high-power drive device. For example, when a short circuit current condition occurs in the exemplary motor drive application of FIGS. 1 and 2 (i.e., both devices of an individual inverter are on), high current flows through high-power drive devices 108 and 109 and may destroy high-power drive devices 108 and 109. Accordingly, a fault detection technique detects this desaturation condition. System 200 may send an indicator thereof to processor 100, and system 200 or processor 100 may trigger a shut-down of a corresponding device.

Desaturation fault protection reduces or turns-off overcurrents during the fault condition. In a typical application, terminal 262 is coupled to an external resistor and diode that are coupled to a terminal of high-power drive device 108 (e.g., the collector terminal of an IGBT or drain terminal of a MOSFET). Desaturation detection circuit 214 senses when the collector-emitter voltage (or drain-source voltage, as the case may be) of high-power drive device 108 exceeds a predetermined threshold level (e.g., 7V). Note that the predetermined threshold level of desaturation detection circuit 214 may be externally adjusted based on the forward voltage of one or more diodes coupled to the desaturation resistor coupled to terminal 262 or based on the resistance of the desaturation resistor. In addition, a delay time may be introduced by coupling a capacitor between terminal 262 and an external power supply node.

In general, undervoltage lockout detector 212 prevents application of insufficient voltage to the control terminal of high-power drive device 108 by forcing the output on terminal 264 to be low during power-up of driver product 200. Undervoltage lockout detector 212 detects when the power supply voltage (e.g., VDD2 sensed using terminal 260) exceeds a first predetermined undervoltage lockout threshold voltage and generates an indication thereof, which may be used to disable the lockout condition. Undervoltage lockout detector 212 also detects when the power supply voltage falls below a second predetermined undervoltage lockout threshold, which may be different from the first undervoltage lockout threshold voltage, to provide noise margin for the undervoltage lockout voltage detection. The indicator generated by undervoltage lockout detector 212, may be provided to processor 100 using terminal 252.

Miller clamp 220 reduces effects of parasitic turn-on of high-power drive device 108 due to charging of the Miller capacitor (e.g., the collector-to-gate parasitic capacitor of an IGBT device or the drain-to-gate parasitic capacitor of a MOSFET in other embodiments of high-power device 108). That gate-collector coupling can cause a parasitic turn on of device 108 in response to a high transient voltage (e.g., a gate voltage spike) generated while high-power drive device 108 is turned off. A gate voltage spike is created when turning on another high-power drive device coupled to high-power drive device 108. For example, when turning on upper high power drive device 109, a corresponding lower high-power drive device 108 coupled to upper high-power drive device 109 experiences a voltage change $dV_{CE}/dt$ causing current flow into the gate drive terminal coupled to lower high-power drive device 108. Miller clamp 220 senses that current using terminal 268, coupled to the gate of lower high-power drive device 108. That current creates a voltage drop across any gate resistance and increases the gate-emitter voltage of a corresponding lower high-power drive device. If the gate-emitter voltage exceeds the device threshold voltage (e.g., 2 V), then high-power drive device 108 turns on. A similar parasitic turn-on event occurs when turning on high-power drive device 108 and the corresponding upper high-power drive device 109 is in an off state. Miller clamp 220 couples terminal 268 to ground via a low-resistance switch that hinders or prevents the Miller capacitor current from developing a voltage sufficient to turn on the high-power drive device. In some embodiments of driver product 200, Miller clamp 220 is not needed because a sufficiently sized gate capacitor coupled between the gate and emitter of each high-power drive device 108 shunts any Miller current and raises the level of the transient needed to parasitically turn on the device. However, such embodiments increase the gate charge voltage required to reach the threshold voltage of high-power drive device 108, increase the driver power, and increase switching losses of high-power drive device 108. In other embodiments of driver product 200 that do not use a Miller clamp circuit, secondary-side integrated circuit 203 is referred to a negative voltage rather than ground by coupling terminal 270 to a negative power supply (e.g., −5 V). This configuration provides additional voltage margin to increase the likelihood that the parasitic turn-on transient does not raise the control terminal of high-power drive device 108 above its threshold voltage. However, this configuration requires the additional cost of generating the negative voltage.

Upon detection of a fault condition by modules on secondary-side integrated circuit 203, fault logic 216 generates control signal FAULT, which may initiate shutdown of high-power drive device 108. Fault logic 216 reports the fault condition to processor 100 via primary-side integrated circuit 201. Alternatively, fault logic 216 only reports the fault condition to primary-side integrated circuit 201 and high-power drive device 108 continues operation. Then, primary-side integrated circuit 201 reports the fault condition to processor 100. Since a system may include multiple high-power drive devices (e.g., six high-power drive devices in the exemplary motor control application described herein), shutting down only one of these devices may harm the high-power drive devices or the load. Therefore, in response to detection of a fault, processor 100 may initiate a shutdown of high-power drive device 108 only after detecting a predetermined number of faults over a particular period of time or other condition is satisfied. In at least one embodiment, processor 100 initiates shutdown of high-power drive device 108 independently from any fault detection of driver product 200 (e.g., based on fault detection from another driver product 200 associated with another high-power drive device 108 or 109).

An abrupt shutoff of high-power drive device 108 may result in large di/dt induced voltages. Such voltage spikes could be damaging to the drive circuit or the load. Accordingly, in response to a fault condition, processor 100 or driver product 200 initiates a soft shutdown of high-power drive device 108 that slowly discharges the control terminal of high-power drive device 108 at a rate having a fall time longer than the regular fall time of the output control signal. For example, fault logic 216 receives indicators from undervoltage lockout detector 212 and desaturation detection circuit 214 and generates control signal FAULT based thereon that initiates a soft shutdown. Typical implementations of a soft-shutdown function in a driver product may use an additional terminal or at least one additional external resistor coupled to terminal 264 or terminal 266.

Figure 3:
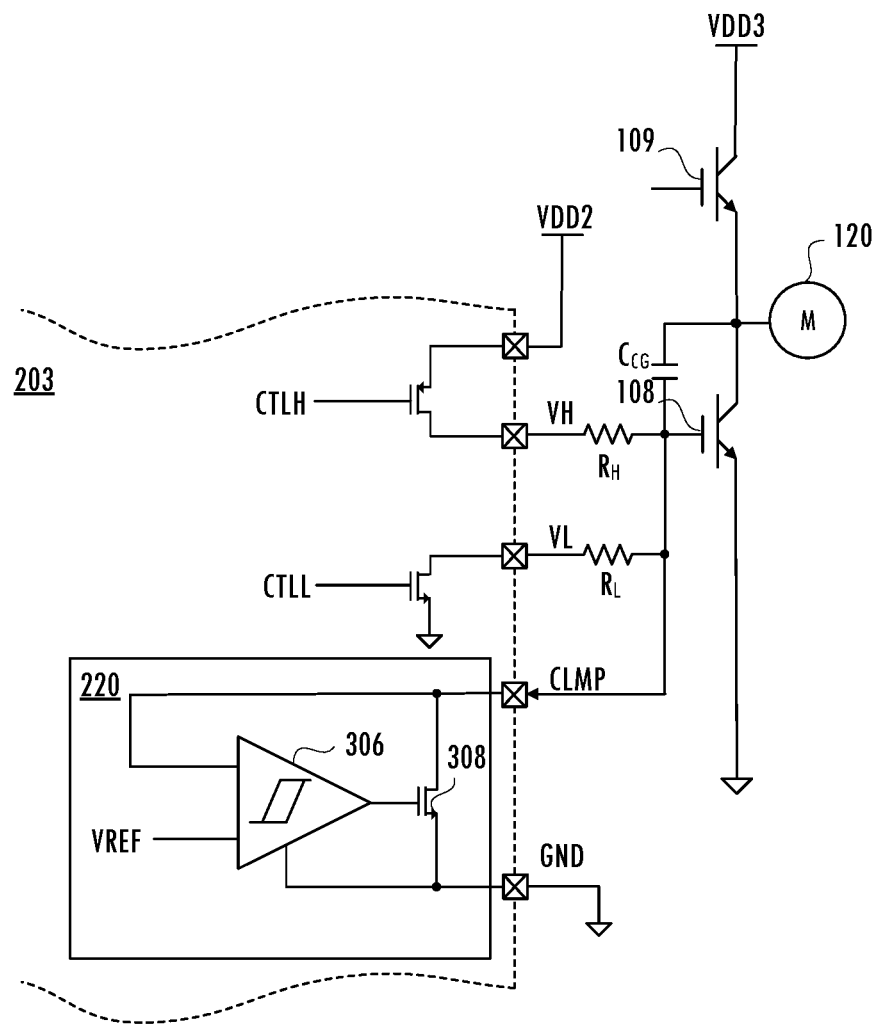
FIG. 3 illustrates a functional block diagram of a portion of the driver control circuit of FIG. 2.

Referring to FIG. 3, in an exemplary embodiment, Miller clamp 220 includes comparator 306 that compares the voltage on the gate terminal of high-power drive device 108 to predetermined reference voltage VREF (e.g., approximately 2 V). In response to the voltage level on the gate terminal of high-power drive device 108 falling below predetermined reference voltage VREF, the output signal of comparator 306 turns on device 308, which provides a path to ground that clamps the gate terminal of high-power drive device 108 to a low voltage level. When high-power drive device 108 is turned off, Miller clamp 220 holds the gate terminal low and prevents it from being pulled high by the Miller capacitance. In general, an effective Miller clamp includes a relatively large device (e.g., a device that has sufficiently low on-resistance) that is directly coupled to the gate terminal of the high-power drive device via a dedicated terminal of a driver product. Otherwise, external resistors for resistances $R_H$ or $R_L$ would render the Miller clamp ineffective. The additional terminal and the relatively large device of the Miller clamp increase the cost of the driver product A technique implements a gate driver with an integrated Miller clamp function using a variable strength gate driver that reduces or eliminates external gate resistors (e.g., external resistors for resistances $R_H$ or $R_L$ or external resistors used for soft shutdown) and reduces the number of package pins coupled to the gate of high-power drive device 108, e.g., from package pins VH, VL, and CLMP of driver product 200, to package pin VO of driver product 400. Driver product 400 includes gate driver and Miller clamp functionality similar to the functionality of driver product 200. Unlike driver product 200, driver product 400 includes a variable strength gate driver with integrated Miller clamp that provides digital controllability of slew rate, reduces ringing by controlling gate impedance dynamically while slewing, and improves efficiency by allowing adjustment of the shape of the driving signal waveform. The technique does not use a separate Miller clamp circuit. In some embodiments, driver product 400 implements soft shutdown using the variable strength gate driver with integrated Miller clamp circuit and does not require a separate terminal or external resistor for soft shutdown functionality, therefore reducing package size and cost of the driver product as compared to the embodiment of FIG. 2.

Figure 4:
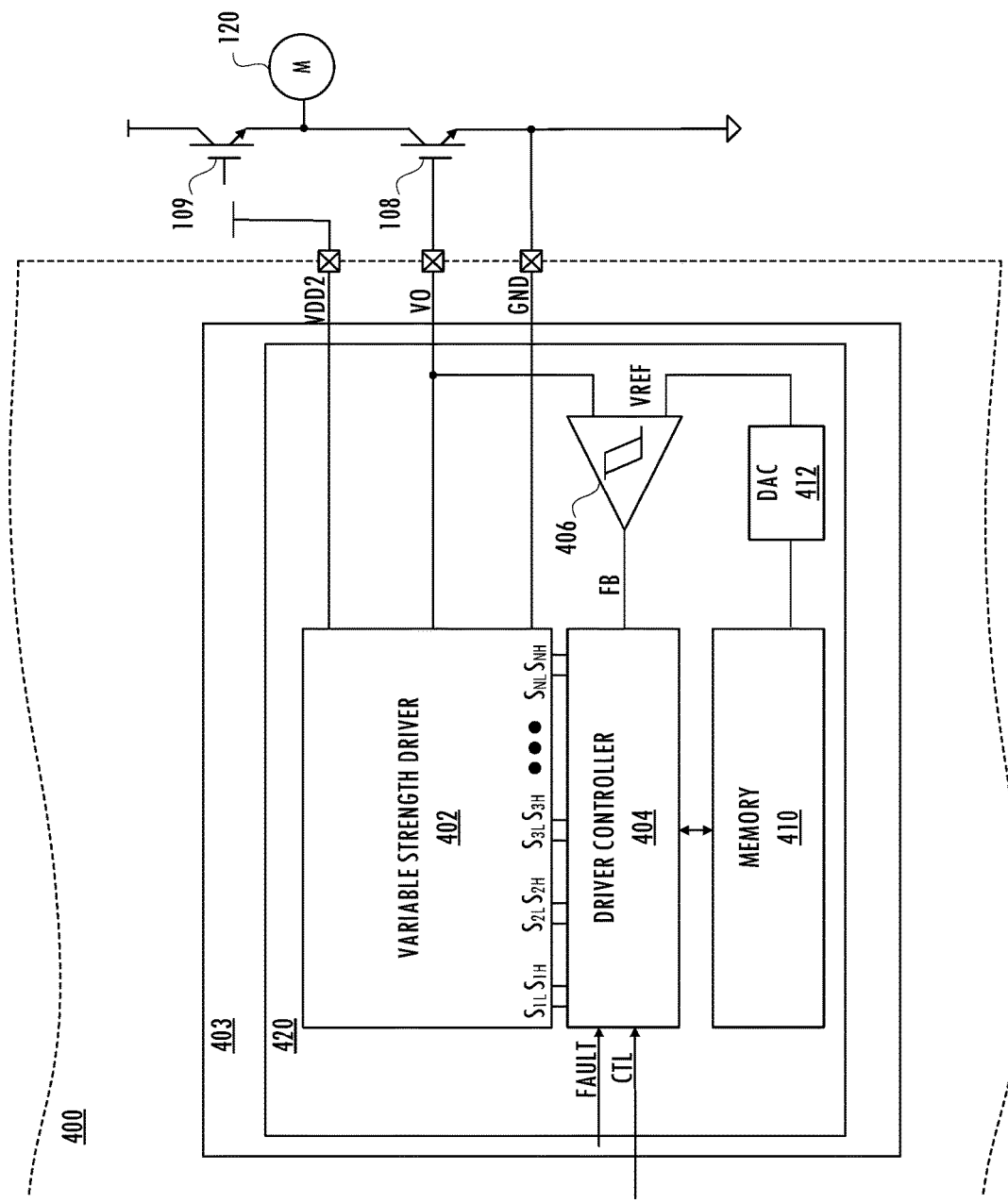
FIG. 4 illustrates a functional block diagram of a portion of a packaged driver integrated circuit product including a gate driver circuit with integrated Miller clamp consistent with at least one embodiment of the invention.

Referring to FIG. 4, in at least one embodiment, driver product 400 includes primary-side integrated circuit 201, isolation barrier 230, and isolation communications channel (not shown in FIG. 4, but described above with reference to driver product 200), and secondary-side integrated circuit 403. In at least one embodiment, secondary-side integrated circuit 403 of driver product 400 includes undervoltage lockout detector 212, desaturation detection circuit 214, and fault logic 216, as described above, and includes gate driver with integrated Miller clamp 420 coupled to terminal VO, which in some embodiments is the only terminal of driver product 400 that is coupled to the gate terminal of high-power drive device 108.

In at least one embodiment, variable strength driver 402 includes a segmented driver. In at least one embodiment of a segmented driver, multiple circuit segments are coupled to the output node and each segment is selectively enabled by driver controller 404. Driver controller 404 configures variable strength driver 402 to implement a pull-up with a first predetermined strength in response to control signal CTL having a first value, configures variable strength driver 402 to implement a first pull-down with a second predetermined strength in response to control signal CTL having a second value, or configures variable strength driver 402 to implement a second pull-down with a third predetermined strength that implements a Miller clamp in response to control signal CTL having the second value and feedback signal FB indicating that the voltage on the gate terminal of high-power drive device 108 has fallen below predetermined voltage level VREF. In at least one embodiment, driver controller 404 configures variable strength driver 402 to implement a third pull-down with a fourth predetermined strength that implements a soft shutdown in response to control signal FAULT indicating a fault condition. First, second, third, and fourth predetermined strengths, where applicable, are independently selectable using predetermined digital codes used to generate control signals $S_{1H}$, $S_{1L}$, $S_{2H}$, $S_{2L}$, $S_{NH}$, and $S_{NL}$ that may be stored in memory 410. Predetermined digital codes and other configuration parameters may be preloaded into memory 410, received from a serial interface of driver product 400, or provided to memory 410 using other techniques.

In at least one embodiment, driver controller 404 receives control signal CTL from primary-side integrated circuit 201 across isolation barrier 130 and receives a feedback signal from comparator 406, which in some embodiments is a hysteretic comparator. In at least one embodiment, comparator 406 receives a predetermined signal level from digital-to-analog converter 412. The predetermined signal level may be based on a target device type and adjusted during product characterization or test (e.g., to compensate for process variations). The predetermined signal level code is stored digitally in memory and later converted to an analog signal for use by comparator 406. The predetermined signal level code may be user-programmable and loaded into memory 410 or otherwise stored on secondary-side integrated circuit 403 via a serial interface, during manufacture and test or in the field by a user. The corresponding predetermined signal level varies with the type of device used for high-power drive device 108. In other embodiments, an analog-to-digital converter digitizes a level of a signal on terminal VO and digital comparison logic is used to generate feedback signal FB.

In at least one embodiment of secondary-side circuit 403, at least one set of digital codes corresponding to the pull-up strength, the first, second, or third pull-down strengths, if any, are user-selectable and stored in memory 410. Driver controller 404 accesses those digital codes to determine which segments of variable strength driver 402 to enable or disable in response to a condition (e.g., a condition based on a level of control signal CTL and a level of the feedback signal). Predetermined digital codes will vary with the threshold voltage of the high-power drive device 108 or 109 and the target application.

Figure 5:
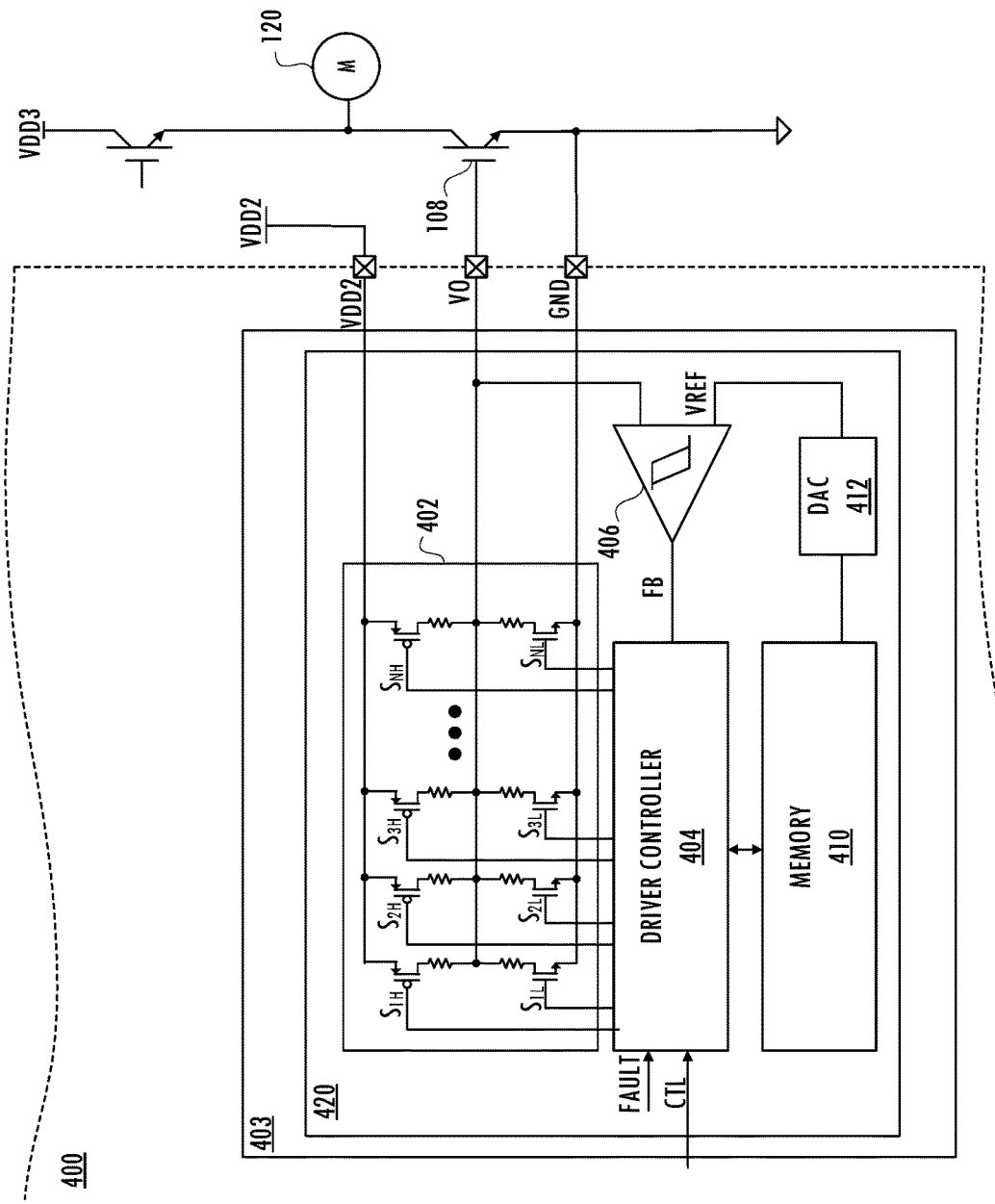
FIG. 5 illustrates a functional block diagram of a portion of a packaged driver integrated circuit product including an exemplary variable strength driver circuit configured as part of the gate driver with integrated Miller clamp consistent with at least one embodiment of the invention.

Referring to FIG. 5, in at least one embodiment, variable strength driver 402 includes N segments, each of the N segments includes an individually controllable pull-up device responsive to corresponding control signal $S_{Hn}$ and an individually controllable pull-down device responsive to corresponding control signal $S_{Ln}$. Individual segments may include pull-up and pull-down devices having the same sizes as in other segments or having different sizes from other segments (e.g., binary-weighted sizes). In at least one embodiment, only channel resistance is included, although in other embodiments, additional resistances are coupled between the pull-up device of a segment and the output node and the pull-down device of the segment and the output node. Accordingly, driver controller 404 can digitally control the slew rate of the signal on the output node coupled to a gate terminal of high-power drive device 108.

In at least one embodiment of gate driver with integrated Miller clamp 420, different numbers of segments are selectively enabled to charge the node coupled to terminal VO with a predetermined pull-up strength under normal output driver operating conditions, to discharge the node coupled to terminal VO with a first pull-down strength under normal output driver operating conditions, to slowly discharge the node coupled to terminal VO to implement soft shutdown with a second pull-down strength in a fault condition, or to clamp the node coupled to terminal VO with a third pull-down strength in a Miller clamp configuration. In at least one embodiment, driver controller 404 generates control signals $S_{Hn}$ and $S_{Hn}$ based on control signal FAULT, control signal CTL, and feedback signal FB. In other embodiments, driver controller 404 generates control signals $S_{Hn}$ and $S_{Hn}$ based on control signal CTL and feedback signal FB only. In at least one embodiment, driver controller 404 controls the gate impedance dynamically according to load conditions while switching the voltage on terminal VO. For example, rather than enable or disable a predetermined number of segments concurrently, driver controller 404 may sequentially turn on or turn off individual segments until all of the predetermined number of segments are on or off, respectively. Some embodiments of driver controller 404 dynamically control the gate impedance to compensate for effects of processing, voltage, or temperature variations, to improve efficiency of motor 120, or to reduce electrical noise (e.g., conducted or radiated noise).

In general, the on-resistance of a transistor varies with temperature variations. Accordingly, in at least one embodiment, driver controller 404 adjusts the voltage level applied to gates of transistors in variable strength driver 402 to maintain a constant on impedance (e.g., a constant pull-up resistance or a constant pull-down resistance) as temperature changes. For example, driver controller 404 includes a temperature sensor or receives temperature information and as the temperature of driver product 400 increases, driver controller 404 increases the gate voltages applied to segments of variable strength driver 402 to maintain a constant pull-up resistance or constant pull-down resistance as a function of temperature.

Although FIG. 5 illustrates variable strength driver 402 including N inverter segments that can be digitally controlled, other embodiments use variable current sources or other techniques to implement a variable strength driver. In an embodiment, gate driver with integrated Miller clamp 402 includes one or more variable current sources that are controlled by an analog signal based on a digital control word provided by driver controller 404 to implement a variable drive strength. When the gate voltage falls to the predetermined voltage level, driver controller 404 enables pull-down transistors in all of the segments to implement the Miller clamp function. Although embodiments described above integrate resistances $R_H$ and $R_L$ and soft-shutdown resistances, in other embodiments, only resistance $R_H$ or resistance $R_L$ is integrated and an additional output terminal is used (e.g., terminal VO coupled to an external resistor $R_H$ and terminal VL coupled directly to the control gate of the high-power drive device).

Thus, a gate driver with an integrated Miller clamp has been described. The gate driver eliminates at least some gate resistors and reduces the number of package pins needed to implement pull-up, pull-down, soft shutdown, and Miller clamp functions of VH, VL, and CLMP package pins of driver product 200, e.g., to a single package pin VO of driver product 400 allowing gate driver to use a smaller package and reduce costs. In some embodiments, the gate driver techniques described herein provide customer programmability of slew rate and can reduce or minimize ringing by controlling the gate impedance dynamically while slewing the signal on the gate terminal. Controlling the shape of the waveform can improve the efficiency of the high-power load system by allowing faster rise and fall times of signals on the high-power drive device control terminals while maintaining parasitic ringing on the control terminal at acceptable levels. In contrast, conventional drivers fix resistances $R_H$ and $R_L$ to meet ringing specifications, resulting in rise times and fall times that are slower than those needed to achieve target efficiency specifications.

The description of the invention set forth herein is illustrative and is not intended to limit the scope of the invention as set forth in the following claims. For example, while the invention has been described in an embodiment in which driver product 400 is coupled to an IGBT high-power drive device, one of skill in the art will appreciate that the teachings herein can be utilized with other device types. In addition, while the invention has been described in embodiments in which driver product 400 is used in a motor application, one of skill in the art will appreciate that the teachings herein can be utilized in other applications. Variations and modifications of the embodiments disclosed herein, may be made based on the description set forth herein, without departing from the scope of the invention as set forth in the following claims.

What is claimed is:

1. A method for controlling a high-power drive device coupled to a terminal of a package housing a driver integrated circuit coupled to the terminal, the method comprising:
generating an indication of a level of a signal on the terminal with respect to a predetermined signal level; and
configuring a variable strength driver of the driver integrated circuit based on a control signal and the indication, wherein the configuring comprises:
configuring the variable strength driver as an output driver circuit in response to the signal on the terminal exceeding the predetermined signal level, the output driver circuit being responsive to the control signal; and
configuring the variable strength driver as an active Miller clamp circuit in response to the control signal having a first logic value and the signal on the terminal falling below the predetermined signal level.

2. The method, as recited in claim 1, wherein the terminal is coupled to a control terminal of the high-power drive device.

3. The method, as recited in claim 1, wherein configuring the variable strength driver comprises:
enabling a first predetermined number of segments of a plurality of segments of the variable strength driver to discharge the terminal in response to the first logic value of the control signal and a second logic value of the indication.

4. The method, as recited in claim 3, wherein configuring the variable strength driver further comprises:
enabling a second predetermined number of segments of the plurality of segments to discharge the terminal in response to the first logic value of the control signal and a third logic value of the indication.

5. The method, as recited in claim 4, wherein the second predetermined number of segments is greater than the first predetermined number of segments.

6. The method, as recited in claim 3, wherein configuring the variable strength driver comprises:
enabling a third predetermined number of segments of the plurality of segments of the variable strength driver to charge the terminal in response to a third logic value of the control signal.

7. The method, as recited in claim 6, wherein configuring the variable strength driver comprises:

enabling a fourth predetermined number of segments of the plurality of segments of the variable strength driver to discharge the terminal in response to a fault condition.

8. The method, as recited in claim 1, further comprising:
charging a node of the high-power drive device over a first length of time in response to a second logic value of the control signal; and
discharging the node of the high-power drive device over a second length of time, in response to the first logic value of the control signal, the second length of time being different from the first length of time.

9. The method, as recited in claim 1, further comprising:
isolating a first portion included in the driver integrated circuit including the variable strength driver from a second portion housed by the package; and
receiving the control signal by the first portion from the second portion, wherein the controlling is performed by the first portion.

10. The method, as recited in claim 1, further comprising:
adjusting a level of control signals provided to the variable strength driver in response to temperature variation.

11. A driver circuit for controlling a high-power drive device external to a package of the driver circuit, the driver circuit comprising:
an output node;
a variable strength driver circuit coupled to the output node;
a feedback circuit configured to generate a feedback signal based on a predetermined signal level and a signal level on the output node; and
a driver controller circuit responsive to a received control signal and the feedback signal to configure the variable strength driver circuit as an output driver in response to the signal level exceeding the predetermined signal level, the output driver being responsive to the received control signal, and to configure the variable strength driver circuit as an active Miller clamp circuit in response to the received control signal having a first logic value and the signal level falling below the predetermined signal level.

12. The driver circuit, as recited in claim 11, further comprising:
wherein the variable strength driver circuit comprises a plurality of segments and the driver controller circuit is configured to:
enable a first predetermined number of segments of the plurality of segments to discharge the output node in response to the first logic value of the received control signal and a second logic value of the feedback signal;
enable a second predetermined number of segments of the plurality of segments to discharge the output node in response to the first logic value of the received control signal and a third logic value of the feedback signal; and
enable a third predetermined number of segments of the plurality of segments of the variable strength driver circuit to charge the output node in response to a fourth logic value of the received control signal,
wherein the first predetermined number of segments is less than the second predetermined number of segments.

13. The driver circuit, as recited in claim 11, further comprising:
a terminal of the package coupled to the output node;
a first power supply terminal of the package; and
a second power supply terminal of the package,
wherein the high-power drive device includes a control terminal coupled to the terminal, and
wherein the variable strength driver circuit is coupled to the first power supply terminal and the second power supply terminal.

14. The driver circuit, as recited in claim 11, wherein the variable strength driver circuit is configured as the output driver and is configured to charge the output node over a first length of time in response to a second logic value of the received control signal and is configured to discharge the output node over a second length of time in response to the first logic value of the received control signal.

15. The driver circuit, as recited in claim 14, wherein the first length of time and the second length of time are based on predetermined values.

16. The driver circuit, as recited in claim 14, wherein the second length of time is different from the first length of time.

17. The driver circuit, as recited in claim 14, wherein the driver controller circuit is further responsive to a fault signal and the variable strength driver circuit is configured to discharge the output node over a third length of time in response to the fault signal, the third length of time being longer than the second length of time.

18. A method for controlling a high-power drive device external to a package of a driver circuit, the method comprising:
configuring a variable strength driver circuit as an output driver circuit in response to a voltage on a terminal of the package being greater than a predetermined voltage level, the output driver circuit being responsive to a received control signal; and
configuring the variable strength driver circuit as a Miller clamp circuit in response to a signal on the terminal falling below the predetermined voltage level.

19. The driver circuit, as recited in claim 12, wherein each segment of the plurality of segments comprises:
an individually controllable pull-up device responsive to a first corresponding control signal and an individually controllable pull-down device responsive to a second corresponding control signal.

20. The method, as recited in claim 18, wherein configuring the variable strength driver circuit as the output driver circuit comprises:
enabling a first predetermined number of segments of a plurality of segments of the variable strength driver circuit to discharge the terminal in response to a first logic value of the received control signal.

21. The method, as recited in claim 20, wherein configuring the variable strength driver circuit as the Miller clamp circuit further comprises:
enabling a second predetermined number of segments of the plurality of segments to discharge the terminal in response to the first logic value of the received control signal,
wherein the second predetermined number of segments is greater than the first predetermined number of segments.

* * * * *